United States Patent [19]
Choi et al.

[11] Patent Number: 5,732,018
[45] Date of Patent: Mar. 24, 1998

[54] SELF-CONTAINED REPROGRAMMING NONVOLATILE INTEGRATED CIRCUIT MEMORY DEVICES AND METHODS

[75] Inventors: Do-Chan Choi, Seoul; Tae-Sung Jung; Woung-Moo Lee, both of Kyungki-do; Ejaz Haq; Syed Ali, both of Seoul, all of Rep. of Korea

[73] Assignee: Samsung Electronics Co., Ltd., Suwon, Rep. of Korea

[21] Appl. No.: 739,276

[22] Filed: Oct. 29, 1996

[30] Foreign Application Priority Data

Oct. 30, 1995 [KR] Rep. of Korea ............... 38186/1995

[51] Int. Cl.$^6$ ............... G11C 11/34; G11C 7/00
[52] U.S. Cl. ............... 365/185.17; 365/185.21; 365/185.25; 365/185.29; 365/218
[58] Field of Search ............... 365/185.17, 185.21, 365/185.29, 218, 185.25

[56] References Cited

U.S. PATENT DOCUMENTS

| | | | |
|---|---|---|---|
| 5,446,690 | 8/1995 | Tanaka et al. | 365/185.17 |
| 5,473,563 | 12/1995 | Suh et al. | 365/185.13 |
| 5,511,022 | 4/1996 | Yim et al. | 365/185.17 |

*Primary Examiner*—David C. Nelms
*Assistant Examiner*—Trong Phan
*Attorney, Agent, or Firm*—Myers Bigel Sibley & Sajovec

[57] ABSTRACT

Nonvolatile integrated circuit memory devices, such as EEPROMs, use unselected shared latching sense amplifiers to latch data from memory cells which are to be reprogrammed after a page erase, and to resupply the latch data to the memory cells which are to be programmed after erase, to thereby internally reprogram the latched data into erased memory cells after page programming. Transferring circuits and methods are provided for transferring data between shared latching sense amplifiers to permit internal reprogramming. High speed and simplified reprogramming of EEPROMs is thereby provided.

14 Claims, 11 Drawing Sheets

SELF-CONTAINED REPROGRAMMING NONVOLATILE INTEGRATED CIRCUIT MEMORY DEVICES AND METHODS

FIELD OF THE INVENTION

The present invention relates to integrated circuit memory devices and methods, and more particularly to electrically erasable and programmable nonvolatile semiconductor memories (hereinafter referred to as "EEPROMs") and methods.

BACKGROUND OF THE INVENTION

EEPROMs are widely used in computer systems. As compared with hard disk devices, EEPROMs are generally light, small and consume low power. Accordingly, the EEPROMs are particularly attractive for portable computer systems.

Development efforts have focused on increasing the memory capacity of EEPROMs and enhancing the performance thereof. In order to increase the memory capacity, an EEPROM has been developed which has a NAND-structured cell array that can reduce the number of contact holes and select transistors per cell.

FIGS. 1 to 3 schematically illustrate a conventional NAND-structured cell array. FIG. 1 illustrates an equivalent circuit diagram, FIG. 2 illustrates a plan view of a NAND cell unit in FIG. 1, and FIG. 3 illustrates a cross sectional diagram taken along line III—III of FIG. 2.

Referring now to FIGS. 1 to 3, a P-type well region 3 is formed on an N-type well region 2 in a P-type semiconductor substrate 1. A memory cell array 20 is formed on the P-type well region 3 and has a plurality of NAND cell units NU (hereinafter referred to as "cell units") arranged in a matrix form of rows and columns. Each cell unit NU has a first select transistor ST1, a second select transistor ST2 and a plurality of series-connected memory transistors M1 to M8 between the source of the first select transistor ST1 and the drain of the second select transistor ST2. The first select transistor ST1, memory transistors M1 to M8 and second select transistor ST2 are connected in series via source-drain common regions 6-1 to 6-9. Floating gates 8-1 to 8-8 are formed over the channels of the memory transistors M1 to M8 through tunnel oxide layers ii, and control gates 10-1 to 10-8 are formed over the floating gates 8-1 to 8-8 through intermediate insulating layers 12.

The memory cell array 20 has a plurality of memory blocks MBk (k=1,2, ... n), each memory block having a plurality of cell units arranged in a given row. The gates 9-1 of the first select transistors ST1, the control gates 10-1 to 10-8 of the memory transistors M1 to M8 and the gates 9-2 of the second select transistors ST2 within each memory block, are respectively connected to a first select line SSL, a plurality of word lines WL0 to WL7 and a second select line GSL. One end of the cell units of each memory block, e.g. the drains 5 of the first select transistors ST1, are respectively connected to a plurality of bit lines BL0 to BLn via contact holes 14. The other ends of the cell units, e.g. the sources 7 of the second select transistors ST2, are connected to a common source line CSL.

As illustrated in FIGS. 1 to 3, a conventional EEPROM may include a single memory cell array. Unfortunately, with the increase of the memory capacity of the EEPROM, the lengths of the word lines and bit lines within the memory cell array also tend to increase, generally resulting in an increase in resistance and parasitic capacitance of the word lines and bit lines. These problems may cause an increase in the random access time, i.e. the time required to read the data from the memory transistors connected to a selected word line via the bit lines. Furthermore, the data sensing and latching circuits 16-0 to 16-n respectively connected to the bit lines BL0 to BLn, may need more time in sensing and latching the data. Thus, the random access time may reach several microseconds. These problems may prevent high speed read operations in an EEPROM.

In order to solve these problems, it has been proposed to divide a memory cell array into a plurality of memory cell arrays, and thereby reduce the length of the word lines and bit lines within each memory cell array. In addition, each bit line pair within each memory cell array has been connected to a latch-type sense amplifier, e.g. a dynamic differential amplifier as used in dynamic random access memories (DRAM). The reduction of the length of the word lines and bit lines can reduce the resistance and capacitance of the word lines and bit lines, and thereby allow high speed read operation.

Moreover, by utilizing a shared latching sense amplifier which is connected to each bit line pair, such as a folded bit line type, high speed read operations may be obtained by the high speed sensing operation of the sense amplifier. Each sense amplifier is connected to two adjacent bit lines, and amplifies and latches the voltage difference between a data voltage from a selected memory cell on one of two adjacent bit lines and a reference voltage on the other bit line during the read operation.

During a programming operation, each sense amplifier generally must latch external data and then program the latched data to a selected memory cell connected to one of two adjacent bit lines which are connected to the sense amplifier. If a memory cell is only placed at one of two crossing points where two bit lines connected to each sense amplifier cross each word line, a reduction of the memory capacity is produced. In order to increase the memory capacity, a memory cell is generally provided at every crossing point where two bit lines connected to each sense amplifier intersect with each word line.

Unfortunately, this high density memory structure may cause problems when a programming operation is executed after page erasing. In particular, since the memory cells connected to one selected word line are all erased during the page erasing, sense amplifiers may need to repeat the latching operations for the external data over two cycles. Stated differently, after the external data latched in the first cycle is programmed into one half of the erased memory cells, the external data latched in the second cycle generally must be programmed into the other half of the erased memory cells in a second cycle.

These data loading operations and programming operations over the two cycles may consume excessive time. Particularly, if there are some memory cells which have data which is to be retained, this data may need to be read out to an external memory and then reprogrammed after erasing the EEPROM. This process may be unduly complex and may require excessive time.

SUMMARY OF THE INVENTION

It is therefore an object of the present invention to provide improved nonvolatile integrated circuit memory devices such as EEPROMs, and associated methods.

It is another object of the present invention to provide improved reprogramming apparatus and methods for nonvolatile integrated circuit memory devices such as EEPROMs.

These and other objects are provided, according to the present invention, by nonvolatile integrated circuit memory devices which use unselected shared latching sense amplifiers to latch data from memory cells which are to be reprogrammed after a page erase and to resupply the latched data to the memory cells which are to be reprogrammed after erase, to thereby internally reprogram the latched data into erased memory cells after page erasing. Transferring circuits and methods are provided for transferring data between shared latching sense amplifiers to permit internal reprogramming. High speed and simplified reprogramming of EEPROMs is thereby provided.

In particular, nonvolatile integrated circuit memory devices according to the present invention, comprise a memory cell array, including a plurality of cell units arranged in rows and columns. Each cell unit comprises a column of a plurality of serially connected memory cells. Each of the memory cells comprises a floating gate and a control gate. A plurality of bit line pairs each includes a first and a second bit line. One end of a respective cell unit is connected to a respective one of the bit lines in the plurality of bit line pairs. A plurality of word lines is also included. A respective one of the word lines is connected to the control gate of the memory cells of a plurality of cell units in a respective row. Finally, the nonvolatile integrated circuit memory device also includes a plurality of shared latching sense amplifiers. A respective one of the shared latching sense amplifiers is connected to the first and second bit lines of a respective bit line pair.

According to the invention, self-contained reprogramming is provided by latching data from selected ones of the memory cells which are connected to a selected one of the word lines, into the plurality of shared latching sense amplifiers, prior to erasing the memory cells which are connected to the selected one of the word lines. The latched data is resupplied from the plurality of shared sense amplifiers to the selected ones of the memory cells which are connected to the selected one of the word lines, after erasing the memory cells which are connected to the selected one of the word lines. The latched data is thereby internally reprogrammed into erased memory cells after page erasing.

In a preferred embodiment, in order to accomplish latching and resupplying, the latched data from selected ones of the plurality of shared sense amplifiers is transferred to selected others of the plurality of shared sense amplifiers prior to erasing the memory cells which are connected to the selected one of the word lines. In order to resupply the latched data, the data from the selected others of the shared sense amplifiers are retransferred to the selected ones of the shared sense amplifiers after erasing the memory cells which are connected to the selected one of the word lines.

According to another aspect of the invention, the data from the selected ones of the memory cells which are connected to a selected one of the word lines which is latched into the plurality of shared latching sense amplifiers prior to erasing the memory cells, is inverted by a plurality of data inverting circuits, a respective one of which is connected between a respective bit line pair and a respective shared latching sense amplifier. The inverting circuits are disabled from inverting the latched data which is resupplied from the plurality of shared sense amplifiers to the selected ones of the memory cells which are connected to the selected one of the word lines after erasing the memory cells which are connected to the selected one of the word lines. A program inhibit voltage is also supplied to unselected ones of the first and second bit lines when resupplying latched data from the plurality of shared sense amplifiers to the selected ones of the memory cells which are connected to the selected one of the word lines, after erasing the memory cells which are connected to the selected one of the word lines.

The present invention is preferably implemented in nonvolatile integrated circuit memory devices which include at least first and second subarrays. Each subarray includes a plurality of cell units arranged in rows and columns. Each cell unit comprises a column of a plurality of serially connected memory cells, each of which includes a floating gate and a control gate. Each subarray also includes a plurality of bit line pairs, each of which includes a first and a second bit line. One end of a respective cell unit is connected to a respective one of the bit lines in the plurality of bit line pairs. The subarray also includes a plurality of word lines, a respective one of which is connected to the control gate of the memory cells of the plurality of cell units in a respective row. Each subarray further includes a plurality of shared latching sense amplifiers, a respective one of which is connected to the first and second bit lines of a respective bit line pair.

The nonvolatile integrated circuit memory devices also include data transferring means, which is connected to the shared latching sense amplifiers in the first subarray and the second subarray. The data transferring means transfers sense and latched data between the plurality of shared latching sense amplifiers in the first array and the plurality of shared latching sense amplifiers in the second subarray.

In particular, data from selected ones of the memory cells which are connected to a selected on the word lines in the selected one of the first and second subarray, is latched into the plurality of shared latching sense amplifiers in the unselected one of the first and second subarrays prior to erasing the memory cells which are connected to the selected one of the word lines in the selected one of the first and second subarrays. The latched data from the plurality of shared sense amplifiers in the unselected one of the first and second subarrays is resupplied to the selected ones of the memory cells which are connected to the selected one of the word lines in the selected one of the first and second subarrays, after erasing the memory cells which are connected to the selected of the word lines in the selected one of the first and second subarrays, to thereby internally reprogram data into erased memory cells after page erasing.

Data which is stored at unselected memory cells which do not require reprogramming and which are connected to a selected word line of a selected one of the first and second memory subarrays, is latched into the plurality of shared latching sense amplifiers in the selected one of the first and second memory subarrays via the unselected bit lines of the first and second bit lines which are associated with the unselected memory cells, prior to erasing the memory cells which are connected to the selected one of the word lines in the selected one of the first and second subarrays. The data which is latched into the plurality of shared latching sense amplifiers in the selected one of the first and second memory subarrays is then transferred into the plurality of shared latching sense amplifiers in the other of the first and second memory arrays. Accordingly, efficient self-contained reprogramming of nonvolatile integrated circuit memory devices is provided.

DETAILED DESCRIPTION OF PREFERRED EMBODIMENTS

Figure 1:
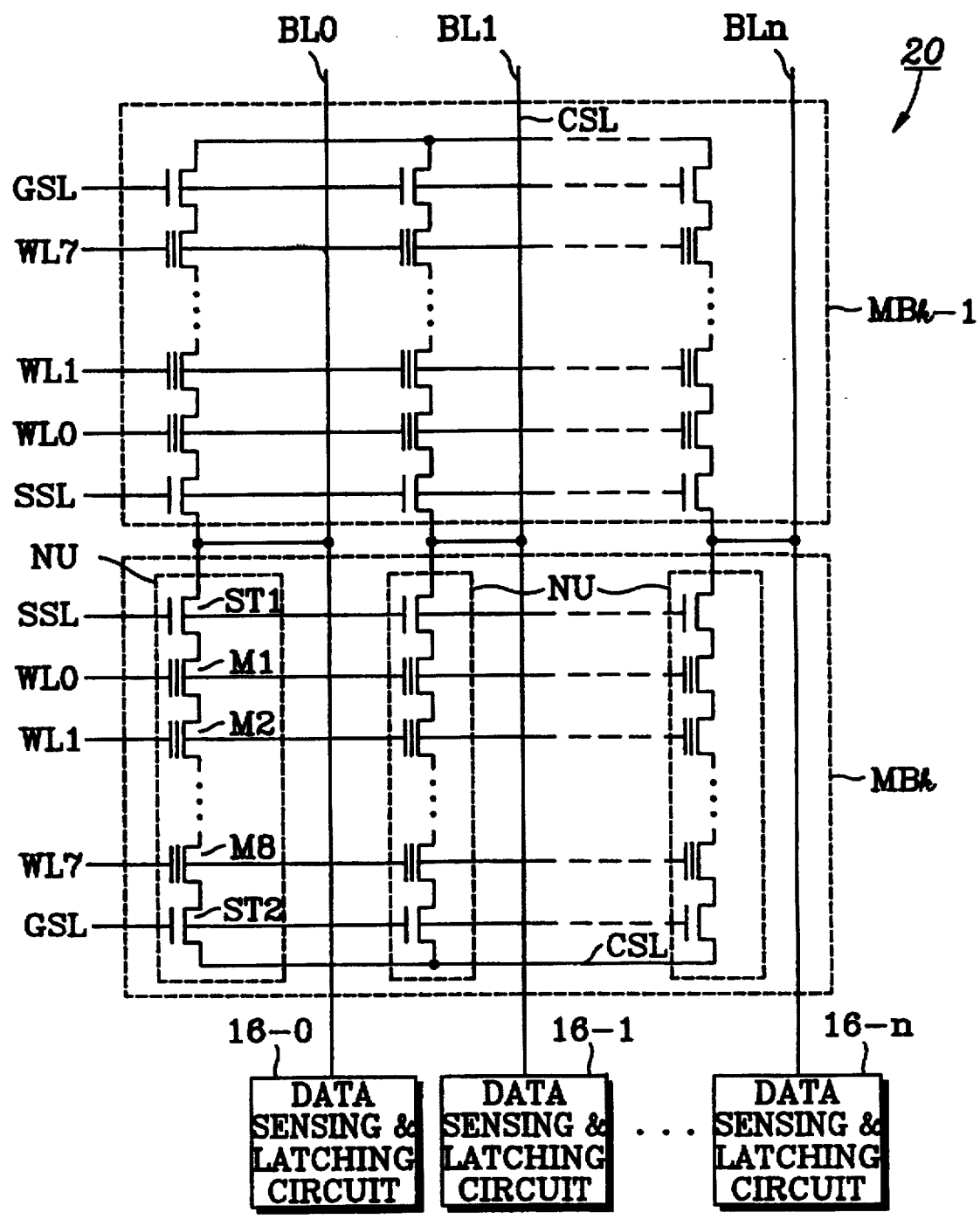
FIG. 1 is a circuit diagram showing a part of a conventional NAND structured cell array.
Figure 2:
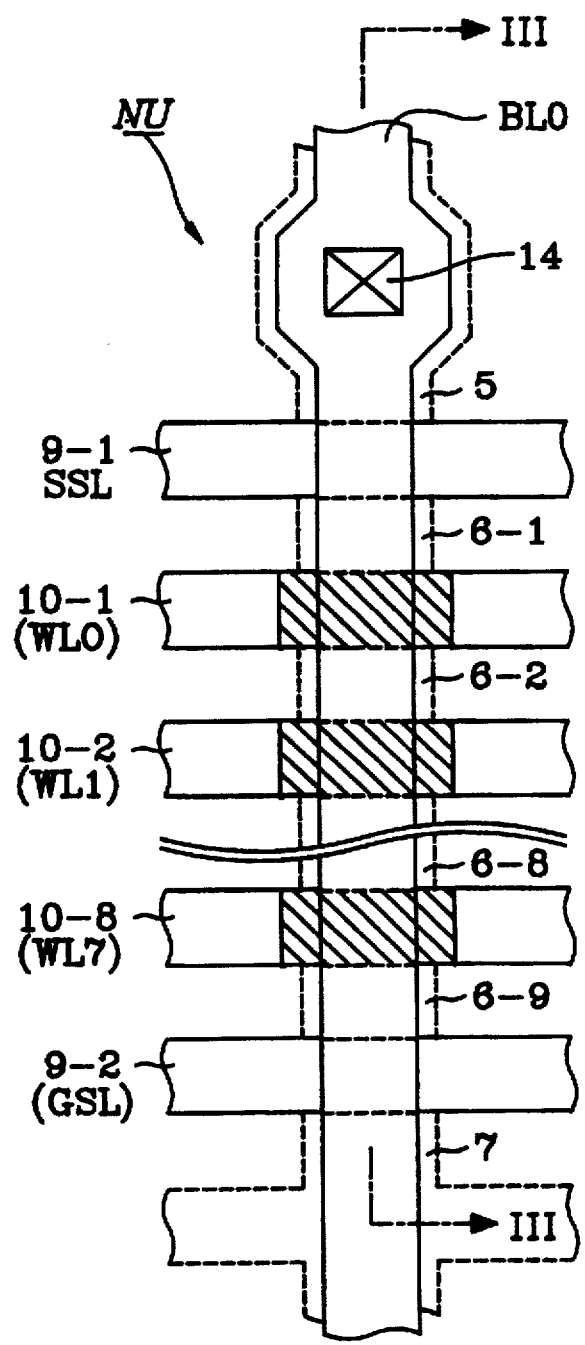
FIG. 2 is a plan view showing one of the NAND cell units in FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P- or N-type; however, each embodiment described and illustrated herein includes its complementary embodiment as well.

The following description uses a 16-Mbit EEPROM having NAND cell units. However, it will be understood that the present invention is not limited to the particular embodiment disclosed herein.

Figure 4:
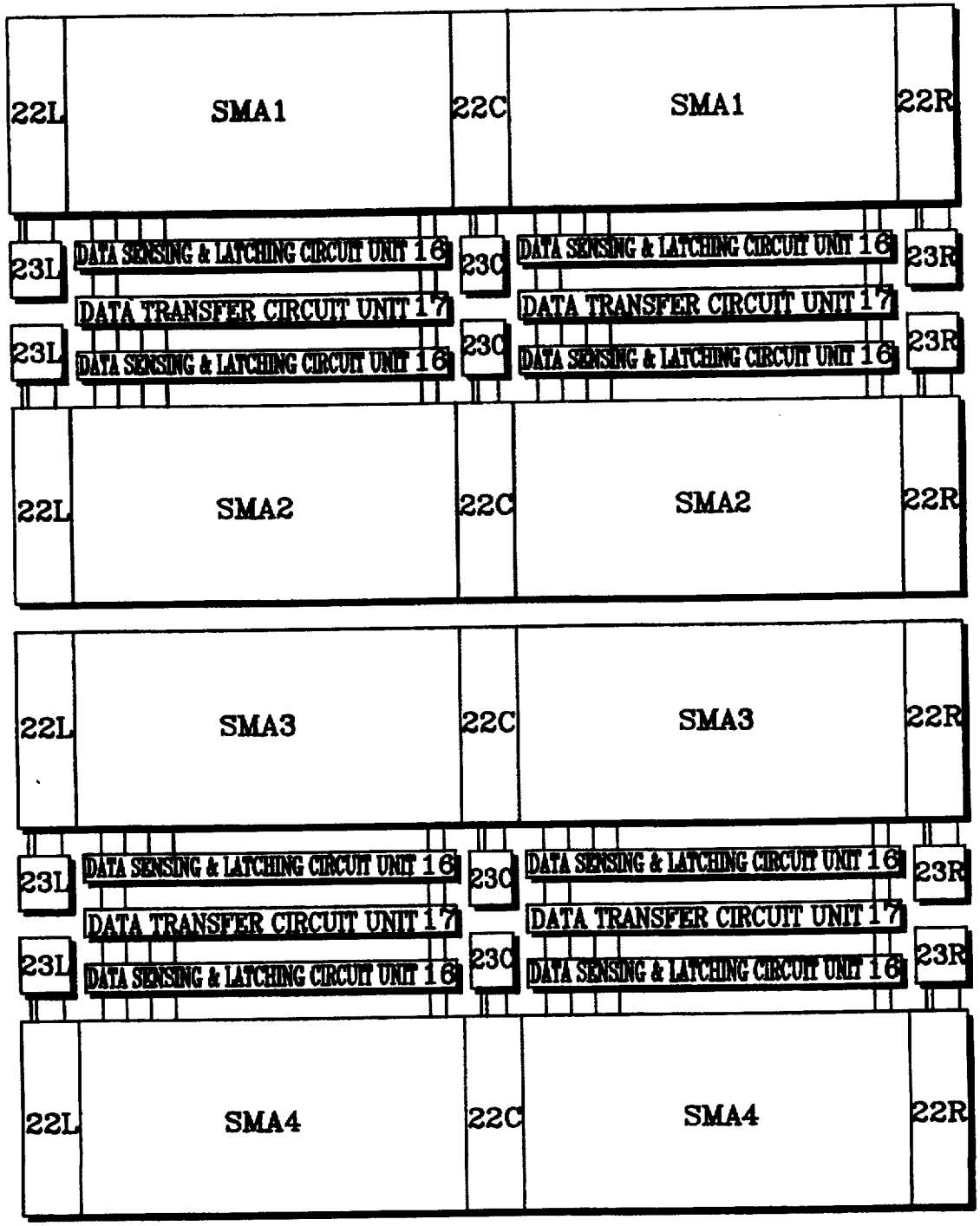
FIG. 4 is a block diagram according to a preferred embodiment of the present invention.

FIG. 4 is a block diagram showing a preferred embodiment of the present invention. In the figure, a memory cell array is divided into first to fourth subarrays SMA1 to SMA4. Each subarray has 4-Mbit memory, i.e. memory cells arranged at the intersections of 1,024 row lines (i.e. word lines) and 4,096 column lines (i.e. bit lines). Each memory cell transistor has a floating gate and a control gate connected to a corresponding one word line. The bit lines are grouped to 2,048 bit line pairs, each bit line pair having first and second bit lines.

Each subarray has a plurality of cell units associated with the first and second bit lines of the bit line pairs, and associated with the word lines. Each cell unit includes a predetermined number of series-connected memory cells placed at the intersection points. Cell units have connection means for connecting the series-connected memory cells to the first and second bit lines.

Transfer switch circuits 22C, 22L and 22R are placed at the center, left and right portions of each subarray in order to transfer the driving voltages from driving circuits 23C, 23L and 23R to selected cell units. The driving circuits 23C, 23L and 23R serve to provide the driving voltages depending on various operating modes, e.g. the programming, reading, erasing and verify operations. Such an arrangement can prevent the increase of the read time due to the increase of the length of the word lines of each subarray. However, it should be noted that the present invention is not limited to the above described driving circuits and transfer switch circuits. The driving circuits and transfer switch circuits disclosed in application Ser. No. 08/653,344, filed on May 24, 1996 entitled "Nonvolatile Integrated Circuit Memories Having Separate Read/Write Paths" or the row decoder disclosed in U.S. Pat. No. 5,473,563 can be used instead of these driving circuits and transfer switch circuits as described above.

The construction and operation of the first and second subarrays SMA1 and SMA2 may be identical to those of the third and fourth subarrays SMA3 and SMA4. That is, if the first subarray SMA1 is selected, the third subarray SMA3 is also simultaneously selected. And if the second subarray SMA2 is selected, the fourth subarray SMA4 is also selected. However, if the first and third subarrays SMA1 and SMA3 are selected, the second and fourth subarrays SMA2 and SMA4 are not selected. In the same way, if the second and fourth subarrays SMA2 and SMA4 are selected, the first and third subarrays SMA1 and SMA3 are not selected. Therefore, the operations associated with the first and second subarrays SMA1 and SMA2 can be identical to those associated with the third and fourth subarrays SMA3 and SMA4. Thus, it should be noted that the present invention can be embodied only by the first and second subarrays SMA1 and SMA2, without the use of the third and fourth subarrays SMA3 and SMA4.

The bit line pairs of each subarray are respectively connected to a corresponding data sensing and latching circuit unit 16 which is comprised of data sensing and latching circuits. The data sensing and latching circuits function to sense and latch the data stored at the memory cells which are connected to one selected word line and associated with selected bit lines of the first and second bit lines during a read operation. In addition, the data sensing and latching circuits serve to program the latched data to the memory cells which are connected to the selected word line and associated with selected bit lines of the first and second bit lines during a program operation. Furthermore, the data sensing and latching circuits serve to sense and latch the data read-out from the memory cells which require the data to have to be contained via selected bit lines of the first and second bit lines before page-erasing the memory cells connected to a selected one of word lines in a selected subarray.

A data transfer circuit unit 17 is connected between the data sensing and latching circuit unit 16 connected to the first subarray SMA1 (or third subarray SMA3) and the data sensing and latching circuit unit 16 connected to the second subarray SMA2 (or fourth subarray SMA4). The data transfer circuit unit 17 serves to transfer the data stored at the data sensing and latching circuit unit 16 associated with a selected subarray to the data sensing and latching circuit unit 16 associated with an unselected subarray before page erasing; and then to transfer the data stored at the data sensing and latching circuit unit 16 associated with an unselected subarray to the data sensing and latching circuit unit 16 associated with a selected subarray.

Figure 5:
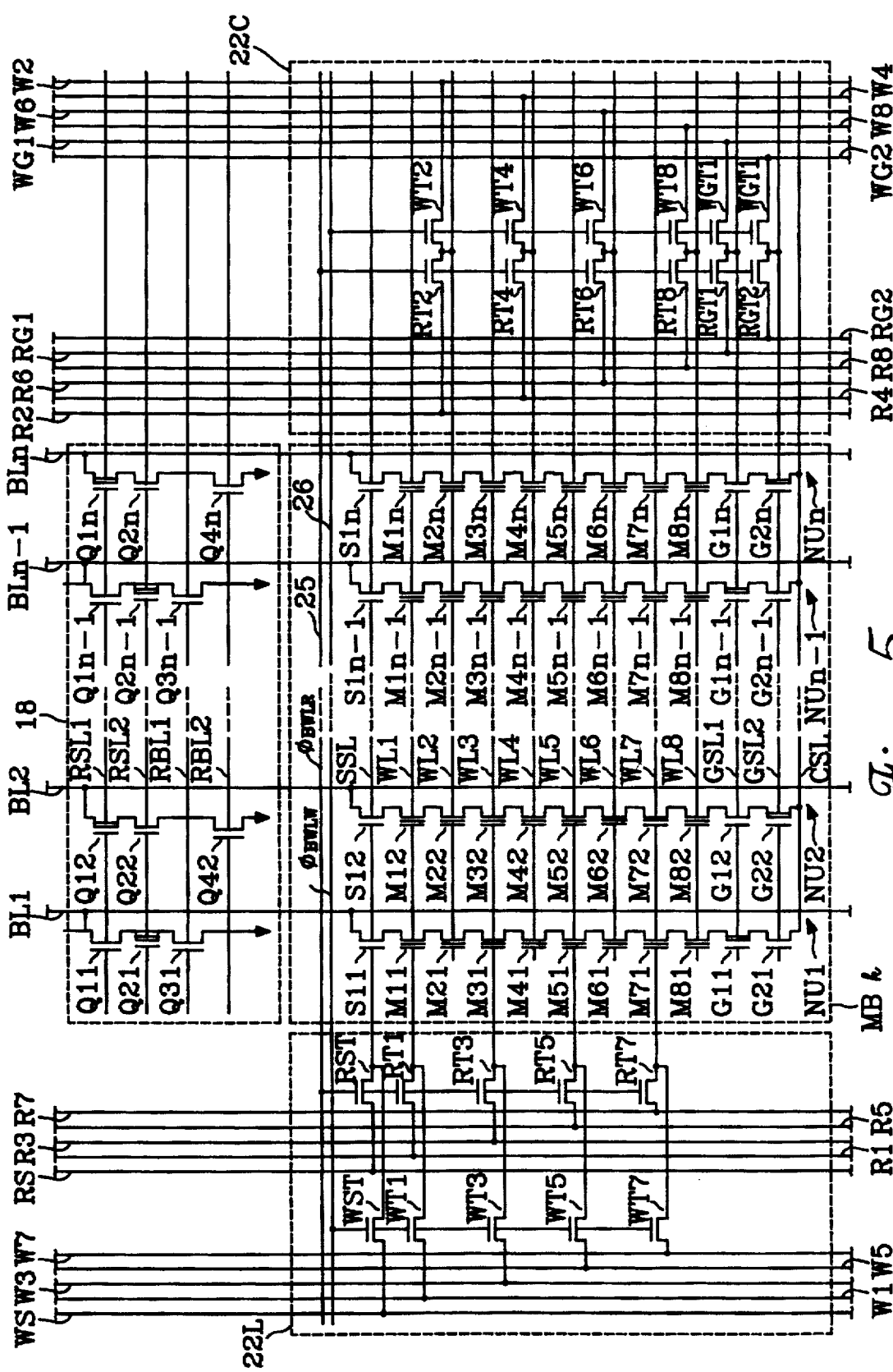
FIG. 5 is a schematic circuit diagram showing a part of each subarray in FIG. 4.

FIG. 5 is a circuit diagram showing the arrangement of a left portion of each sub-memory array, the transfer switch circuits and the reference voltage supplying transistors. FIG. 5 shows the connecting relationship of a portion of the cell units arranged within the memory block MBk corresponding to one of 128 rows and that of 2,048 bit lines BL1 to BLn (n=2,048) of 4,096 bit lines. However, it should be noted that the present invention is not limited to such a number of the bit lines and cell units.

Referring to FIG. 5, the parallel bit lines BL1 to BLn are comprised of odd numbered bit lines, i.e. first bit lines BL1, BL3, ... BLn−1 and even numbered bit lines, i.e. second bit lines BL2, BL4, ... BLn, and adjacent first and second bit line pairs, i.e. BL1, BL2; BL3, BL4; ...; BLn−1,BLn. The memory cells M11 to M8n are arranged in a matrix form of rows and columns at the intersection points of the bit lines BL1 to BLn and the word lines WL1 to WL8. The control gates of the memory cells arranged in a row are connected to a corresponding word line. The memory cells arranged in a column are divided into a predetermined number of groups of memory cells, each group being comprised of cell units.

As can be seen from FIG. 5, each of the cell units NU1 to NUn includes eight series-connected memory cells M1k to M8k (k=1,2, ... n). A respective one end of the series-connected memory cells are respectively connected to the bit lines BL1 to BLn via first select transistors S1k. The first select transistors S11 to S1n are enhancement mode MOS transistors and have their gate electrodes connected to a first select line SSL. The other ends of the series-connected memory cells within the cell units associated with the first bit lines BL1, BL3, ... BLn−1 are connected to a common source line CSL via series-connected transistors G1m and G2m (wherein "m" indicates an odd number). The transistors G1m are depletion mode MOS transistors which are always on normal operation, and have their gates connected to a second select line GSL1. The transistors G2m are enhancement mode MOS transistors and have their gate electrodes connected to a third select line GSL2. The other ends of the series-connected memory cells within the cell units associated with the second bit lines BL2, BL4, ... BLn are connected to the common source line CSL via series-connected transistors G1p and G2p (wherein "p" indicates an even number). The transistors G1p are enhancement mode MOS transistors and have their gates commonly connected to the second select line GSL1. The transistors G2p are depletion mode MOS transistors and have their gates commonly connected to the third select line GSL2. The common source line CSL is typically connected to ground for reading, writing and verify operations.

The first select transistors S1k act as first switches for selecting the cell units NU1 to NUn. The second select transistors G2m, i.e. G21, G23, ... G2n−1 serve as second switches for connecting the other ends of the series-connected memory cells connected to the first bit lines BL1, BL3, ... BLn−1 to the common source line CSL. The third select transistors G1p, i.e. G12, G14, ... G1n serve as third switches for connecting the other ends of the series-connected memory cells connected to the second bit lines BL2, BL4, ... BLn to the common source line CSL.

The second select transistors G2m and the third select transistors G1p are connected between the other ends of the series-connected memory cells and the common source line CSL to improve the read time from the memory cells. However, it is also possible to connect one end of the series-connected memory cells in each of the odd cell units NU1, NU3, ... NUn−1 associated with the first bit lines BL1, BL3, ... BLn−1 to a corresponding first bit line via the series-connected depletion mode MOS transistor and enhancement mode MOS transistor, and to connect the other end thereof to the common source line CSL via the enhancement mode MOS transistor. In addition, it is possible to connect one end of the series-connected memory cells in each of the even cell units NU2, NU4, ... NUn associated with the second bit lines BL2, BL4, ... BLn to a corresponding second bit line via the series-connected enhancement mode MOS transistor and depletion mode MOS transistor, and to connect the other end thereof to the common source line CSL via the enhancement mode MOS transistor.

In other words, in FIG. 5, the first select transistors S11, S12, ... S1n can be exchanged with the series-connected transistors G11 and G21, G12 and G22, ... G1n and G2n. In this case, the gates of the transistors G11, G12, ... G1n are connected to a first select line SSL1, the gates of the transistors G21, G22, ... G2n to a second select line SSL2, and the gates of the transistors S11, S12, ... S1n to a third select line GSL. Thus, in order to read out the data from the memory cells associated with the first bit lines, a logic "low" level, e.g. ground voltage is applied to the first select line SSL1, a logic "high" level, e.g. power supply voltage Vcc is applied to the second select line SSL2 and the "high" level is applied to the third select line GSL.

A reference voltage supplying circuit 18 is connected between each bit line and ground. The reference voltage supplying circuit 18 is comprised of the transistors Q1m, Q2m and Q3m connected in series between each first bit line BLm and ground, and of the transistors Q1p, Q2p and Q4p connected in series between each second bit line BLp and ground. In this case, "m" indicates an odd number and "p" indicates an even number. The transistors Q1m, Q3m, Q2p and Q4p are enhancement mode MOS transistors and the transistors Q2m and Q1p are depletion mode MOS transistors.

The gates of the transistors Q1m and Q1p are connected to a first reference voltage select line RSL1 and the gates of the transistors Q2m and Q2p are connected to a second reference voltage select line RSL2. The gates of the transistors Q3m are connected to a third reference voltage select line RBL1 and the gates of the transistors Q4p are connected to a fourth reference voltage select line RBL2.

The reference voltage supplying circuit 18 serves to supply the read reference voltage to unselected bit lines of the first and second bit lines so as to read out the data from the memory cells within the cell units associated with selected bit lines of the first and second bit lines. That is, when the data is read out from the memory cells within the cell units NU1, NU3, ... NUn−1 associated with the first bit lines BL1, BL3, ... BLn−1, the reference voltage supplying circuit 18 supplies the read reference voltage to the second bit lines BL2, BL4, ... BLn. Even though the gate electrodes of the transistors Q3m and Q4p are respectively connected to the third and fourth reference voltage select lines RBL1 and RBL2 in the preferred embodiment of the present invention, the gate electrodes of the transistors Q3m and Q4p can be connected to one identical reference voltage select line, i.e. the third reference voltage select line.

In order to supply the read reference voltage to the first bit lines BL1, BL3, ... BLn−1, a logic "high" level is applied to the first and third reference voltage select lines RSL1 and RBL1 and a logic "low" level is supplied to the second and fourth reference voltage select lines RSL2 and RBL2. In a modified embodiment, it is also possible to supply the read reference voltage to the selected bit lines of the first and second bit lines by applying the logic "high" level to the third reference voltage select line, applying the logic "high" level to one of the first and second reference voltage select lines RSL1 and RSL2 and the applying logic "low" level to the other of the first and second reference voltage select lines RSL1 and RSL2. As will be described hereinbelow, the read reference voltages are produced by discharging precharge voltages precharged the bit lines BL1 to BLn to a predetermined voltage level.

The transfer switch circuits 22L and 22C serve to supply proper driving voltages as required by each of various operations to the word lines WL1 to WL8 and the first to third select lines SSL, GSL1 and GSL2. The transfer switch circuit 22L has read switching transistors RST, RT1, RT3, RT5 and RT7 and write switching transistors WST, WT1, WT3, WT5 and WT7 for switching the driving voltages on the read driving lines RS, R1, R3, R5 and R7 and write driving lines WS, W1, W3, W5 and W7 to the first select line SSL and the word lines WL1, WL3, WL5 and WL7. The transfer switching circuit 22C has read switching transistors RT2, RT4, RT6, RT8, RGT1 and RGT2 and write switching transistors WT2, WT4, WT6, WT8, WGT1 and WGT2 for switching the driving voltages on the read driving lines R2, R4, R6, R8, RG1 and RG2 and write driving lines W2, W4, W6, W8, WG1 and WG2 to the word lines WL2, WL4, WL6, WL8 and the second and third select lines GSL1 and GSL2.

The gates of the read switching transistors RST, RT1 to RT8, RGT1 and RGT2 are connected to a line 25 to which a read block select signal $\phi_{BWLR}$ is applied from a block select circuit (not shown). The gates of the write switching transistors WST, WT1 to WT8, WGT1 and WGT2 are connected to a line 26 to which a write block select signal $\phi_{BWLW}$ is applied from the block select circuit (not shown). Since the read and write switching transistors are alternately connected to the left end and center portions of the word lines WL1 to WL8, the space between the memory cells may be reduced.

Figure 3:
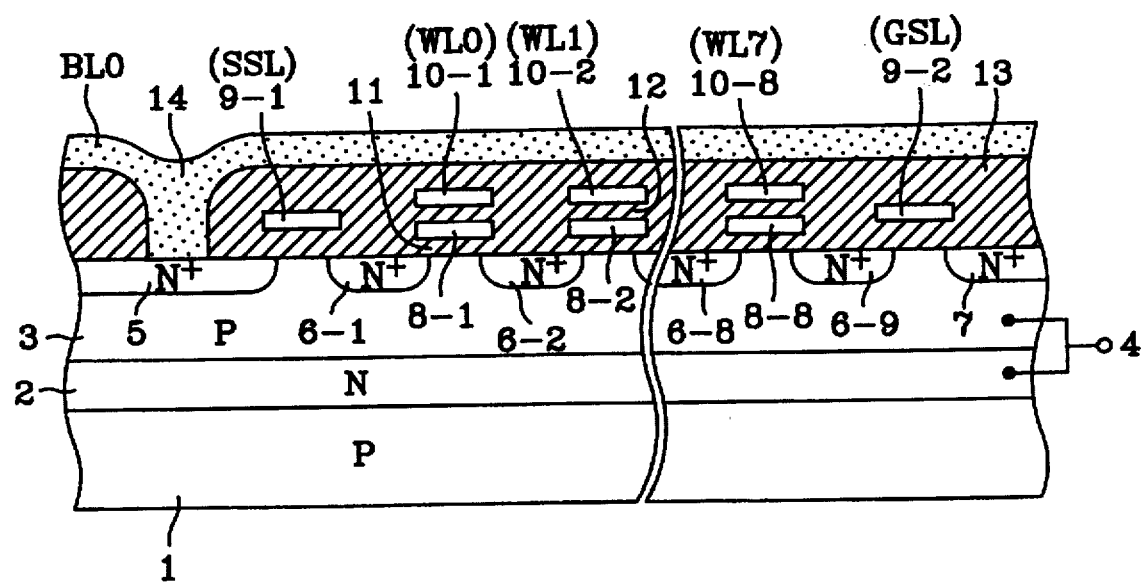
FIG. 3 is a cross sectional diagram taken along line III—III of FIG. 2.

Various operations associated with FIG. 5 will now be discussed. In order to erase memory cells M51 to M5n connected to a word line WL5, the word line WL5 is supplied with a logic "low" level, e.g. ground voltage, the remaining word lines WL1 to WL4 and WL6 to WL8 are floated and an erase voltage, e.g. 20 volts is applied to the electrode 4 connected to the well region 3 of FIG. 3. Then, the memory cells M51 to M5n connected to the word line WL5 become depletion mode MOS transistors having negative threshold voltages due to Fowler-Nordheim tunneling (hereinafter referred to as an "F-N tunneling"). In this case, it is assumed that the memory cells M51 to M5n store data "1". The remaining word lines WL1 to WL4 and WL6 to WL8 are charged to a predetermined voltage level by capacitive coupling due to the application of the erase voltage. The memory cells connected thereto are thereby prevented from being erased. Such a page-erasing can be achieved by applying the logic "low" level to the line 26 and the logic "high" level to the line 25 from the block select circuit (not shown), applying the logic "low" level to the read driving line R5 from the read driving circuit 23L and floating the remaining read driving lines R1 to R4 and R6 to R8.

After page-erasing, an erase verification operation is performed. In order to perform the erase verification operation, the bit lines BL1 to BLn are precharged to a predetermined voltage, e.g. the power supply voltage Vcc, as will be discussed hereinbelow. After precharging, an erase verification voltage is applied to the word line WL5 and simultaneously the logic "high" level is applied to the word lines WL1 to WL4 and WL6 to WL8 and the first to third select lines SSL, GSL1 and GSL2. Thus, if even one of the memory cells connected to the word line WL5 is not erased, the bit line associated with this unerased memory cell remains at the precharge voltage, e.g. the logic "high" level, while the bit lines associated with the erased memory cells are discharged to the logic "low" levels. As will be discussed hereinbelow, the erase verification can be achieved by detecting the logic "high" level.

After the erase verification operation, a program operation is performed. The program operation is separately performed for the memory cells associated with the first bit lines and for the memory cells associated with the second bit lines. For example, in order to program the memory cells M51, M53, ... M5n−1 associated with the first bit lines BL1, BL3, ... BLn−1, the logic "high" level is applied to the first and third select lines SSL and GSL2 and the logic "low" level is applied to the second select line GSL1. At the same time, a program voltage Vpgm, e.g. about 18 volts is applied to the selected word line WL5, a first pass voltage Vpass1 is applied to the word lines WL4 and WL6 adjacent to the selected word line WL5, and a second pass voltage Vpass2, which is higher than the first pass voltage Vpass1 but lower than the program voltage Vpgm, is applied to the remaining word lines WL1 to WL3 and WL7 to WL8.

If the memory cells M53 to M5n−1 of the odd numbered memory cells are ZERO-programmed, and the memory cell M51 is ONE-programmed to contain the erased data "1", then, a program inhibition voltage, e.g. the logic "high" level, is applied to the bit line BL1 and the logic "low" level to the remaining bit lines BL3, BL5, ... BLn−1. The drain, channel and source of the memory cell M51 are charged to a boosting voltage by the capacitance coupling, and thereby the memory cell M51 is inhibited from being programmed. However, the drains, channels and sources of the memory cells M53, M55 ... M5n−1 go to the logic "low" levels, and thereby the memory cells M53, M55, ... M5n−1 become enhancement mode MOS transistors by F-N tunneling. This technology is disclosed in Korean Patent Application Serial No. 7532/1995. If the memory cells M52, M54, ... M5n associated with the second bit lines BL2, BL4, ... BLn are to be programmed, the logic "high" level is applied to the first and second select lines SSL and GSL1 and the logic "low" level to the third select line GSL2. The voltages to be applied to the word lines WL1 to WL8 are the same as the case of programming the memory cells M51, M53, ... M5n−1 associated with the first bit lines BL1, BL3, ... BLn−1. The voltages to be applied to the second bit lines are logic "low" and "high" levels according to the program states, as described above.

Before the read operation, the bit lines BL1 to BLn are precharged to the power supply voltage Vcc. After precharging, if data is to be read out from the memory cells M51, M53 ... M5n−1 associated with the first bit lines BL1, BL3, ... BLn−1, the logic "low" level is applied to the first and third reference voltage select lines RSL1 and RBL1 and the logic "high" level is applied to the second and fourth reference voltage select lines RSL2 and RBL2. In addition, the logic "low" level is applied to the selected word line WL5 and the second select line GSL1 and the logic "high" level is applied to the remaining word lines WL1 to WL4 and WL6 to WL8 and the first and third select lines SSL and GSL2.

Figure 7:
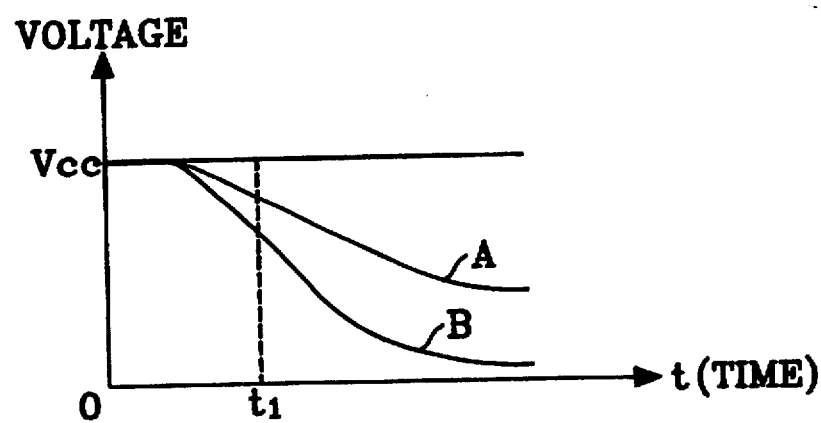
FIG. 7 is a graph showing the relationship between the read reference voltage from a reference voltage generator and the voltage on the selected bit line.

Assume that the memory cell M51 stores the data "1" and the remaining memory cells M53, M55, ... M5n−1 store the data "0". Then, the precharge voltage on the bit line BL1 is discharged to the ground via the memory cell M51 as shown by curve B in FIG. 7. In addition, the precharge voltage on the bit line BL2 is discharged by the turned-on transistors Q22 and Q42 as shown by the curve A in FIG. 7. Therefore; the sense amplifier connected to the bit lines BL1 and BL2 is activated and latches the data stored at the memory cell M51 at time $t_1$ where the voltage difference between the first and second bit lines BL1 and BL2 reaches 120-200 millivolts. Meanwhile; since the memory cells M53, M55, ... M5n−1 are off cells, the bit lines BL3, BL5, ... BLn−1 maintain the precharge voltages. Thus, the voltage on the bit lines BL3, BL5, . . . BLn–1 is higher than the read reference voltage on the bit lines BL4, BL6, . . . BLn by 120–200 millivolts. Hence, the sense amplifier connected to each of the bit line pairs BL3, BL4; BL5, BL6; . . . ; BLn–1, BLn can sense such a voltage difference.

Similarly, in order to read out the data from the memory cells M52, M54, . . . M5n associated with the second bit lines BL2, BL4, . . . BLn, the logic "high" level is applied to the first and second select lines SSL and GSL1 and the unselected word lines WL1 to WL4 and WL6 to WL8 and the logic "low" level is applied to the selected word line WL5 and the third select line GSL2. Simultaneously, the logic "high" level is applied to the first and third reference voltage select lines RSL1 and RBL1 and the logic "low" level to the second and fourth reference voltage select lines RSL2 and RBL2.

Figure 6A:
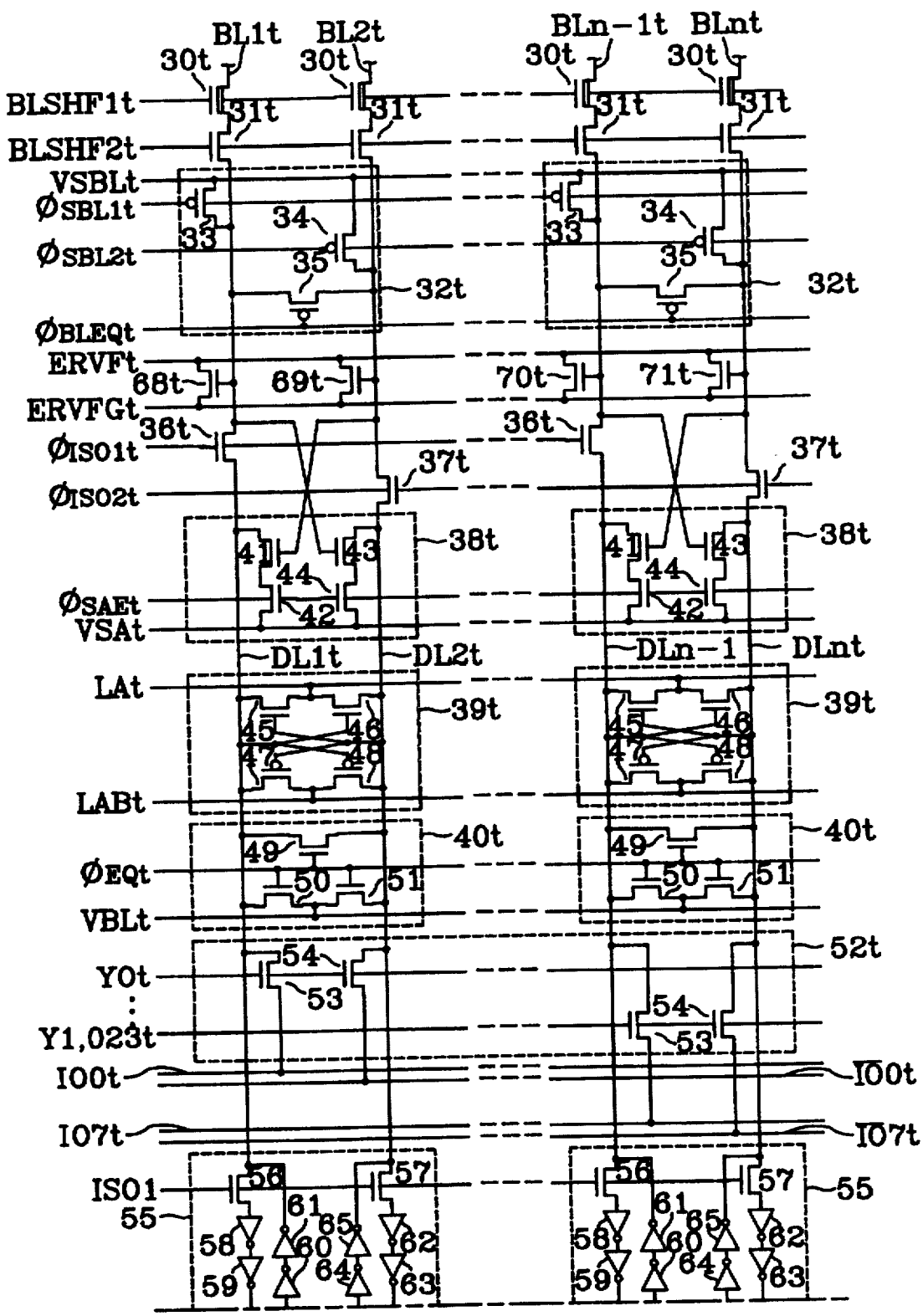
FIG. 6a is a schematic circuit diagram showing a data sensing and latching circuit unit connected to the first and third subarrays in FIG. 4 and a data transfer circuit unit.
Figure 6B:
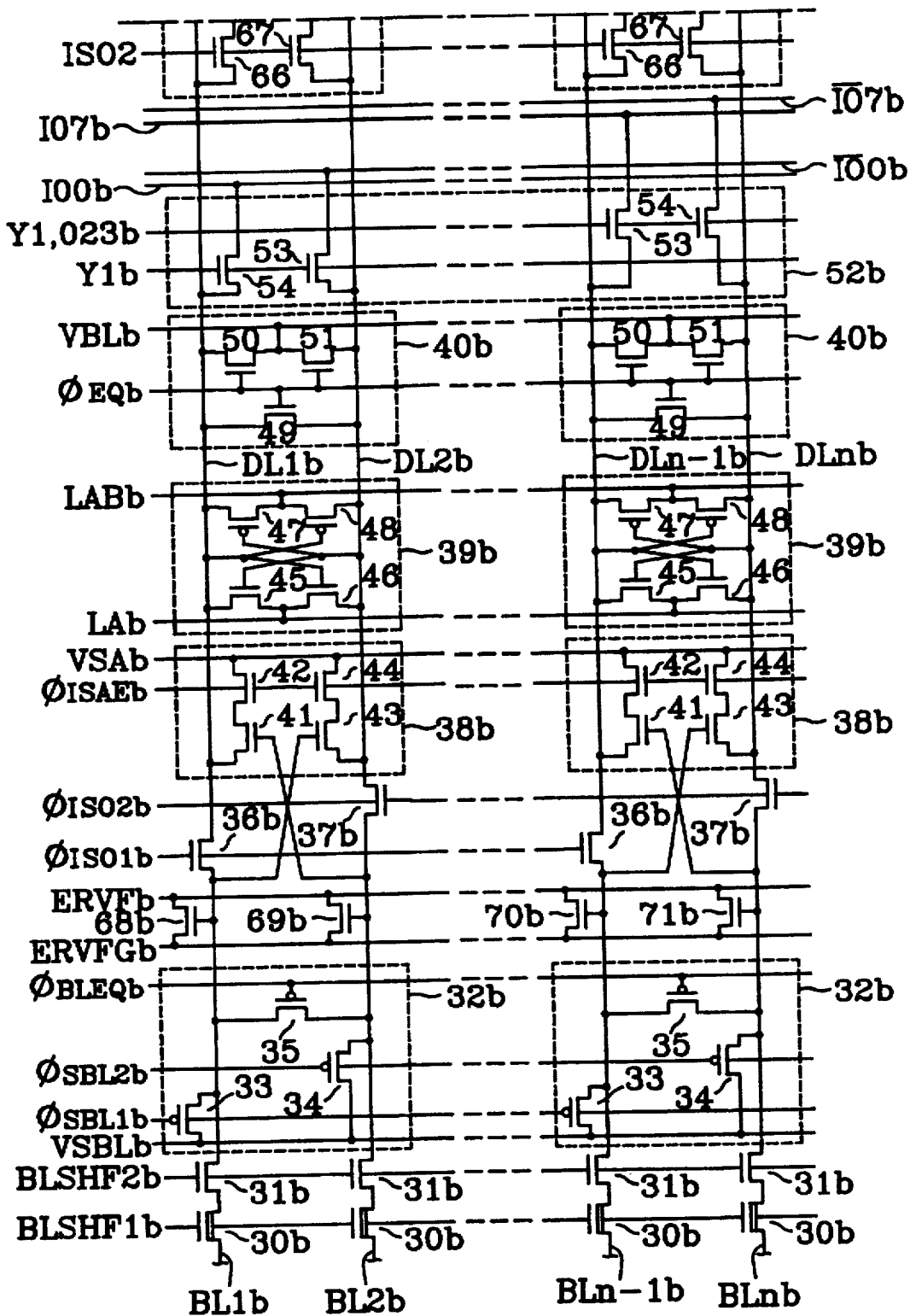
FIG. 6b is a schematic circuit diagram showing a data sensing and latching circuit unit connected to the second and fourth subarrays in FIG. 4.

FIG. 6a is a schematic circuit diagram showing the data sensing and latching circuit unit connected to each of the first and third subarrays in FIG. 4 and the data transfer circuit unit, and FIG. 6b is a schematic circuit diagram showing the data sensing and latching circuit unit connected to each of the second and fourth subarrays in FIG. 4. In the figures, a suffix "t" refers to the components associated with the upper (top) subarrays, i.e. the first and third subarrays and a suffix "b" refers to the components associated with the lower (bottom) subarrays, i.e. the second and fourth subarrays. The bit lines BL1t to BLnt within the first and third subarrays and the bit lines BL1b to BLnb within the second and fourth subarrays are respectively connected to precharge circuits 32t and 32b via the channels of depletion mode transistors 30t and 30b, and enhancement mode transistors 31t and 31b used for preventing the transfer of high voltage. The signals BLSHF1t, BLSHF2t, BLSHF1b and BLSHF2b always stay at the logic "high" levels. But, the signals BLSHF2t and BLSHF2b may go to the logic "high" levels.

Each of the precharge circuits 32t and 32b for precharging the bit lines is comprised of precharge transistors 33 and 34 and an equalizing transistor 35. The transistors 33 to 35 are P-type MOS transistors. The sources of the precharge transistors 33 and 34 are connected to a signal VSBLt (or VSBLb) which stays at the logic "high" level, e.g. the power supply voltage Vcc level, during the precharging operation and the drains thereof are connected to corresponding bit lines. The gates of the transistors 33 and 34 are respectively connected to first and second bit line precharge control signals $\phi_{SBL1t}$ (or $\phi_{SBL1b}$) and $\phi_{SBL2t}$ (or $\phi_{SBL2b}$). The drain and source of each equalizing transistor 35 are respectively connected to the first and second bit lines of a corresponding bit line pair and the gate thereof is connected to a corresponding bit line equalizing control signal $\phi_{BLEQt}$ (or $\phi_{BLEQb}$). The first and second bit lines of each bit line pair are connected to corresponding data lines via the channels of the isolation transistors 36t and 37t (or 36b and 37b). The gates of the isolation transistors 36t and 37t (or 36b and 37b) are respectively connected to first and second isolation control signals $\phi_{ISO1t}$ and $\phi_{ISO2t}$ (or $\phi_{ISO1b}$ and $\phi_{ISO2b}$).

Data line pairs DL1t, DL2t; DL3t, DL4t; . . . ; DLn–1t, DLnt (or DL1b, DL2b; DL3b, DL4b, . . . ; DLn–1b, DLnb) are respectively connected to the bit line pairs BL1t, BL2t; BL3t, BL4t; . . . ; BLn–1t, BLnt via the isolation transistors 36t and 37t (or 36b and 37b). The gates of the isolation transistors 36t (or 36b) are connected to the first isolation control signal $\phi_{ISO1t}$ (or $\phi_{ISO1b}$) and the isolation transistors 37t (or 37b) are connected to the second isolation control signal $\phi_{ISO2t}$ (or $100_{ISO2b}$). A sense amplifier 39t (or 39b) and a precharge circuit 40t (or 40b) for precharging the first and second data lines are connected between the first and second data lines of each data line pair. In addition, a data inverting circuit 38t (or 38b) is connected between the first and second data lines.

The data inverting circuit 38t is comprised of transistors 41 and 42 connected in series between each of the first data lines DL1t, DL3t, . . . DLn–1t (or DL1b, DL3b, . . . DLn–1b) and the signal VSAt (or VSAb) and transistors 43 and 44 connected in series between each of the second data lines DL2t, DL4t, . . . DLnt (or DL2b, DL4b, . . . DLnb) and the signal VSAb (or VSAb). The transistors 41 to 44 are N type MOS transistors. The gates of the transistors 41 are respectively connected to the second bit lines BL2t, BL4t, . . . BLnt (or BL2b, BL4b, . . . BLnb) and the gates of the transistors 43 to the first bit lines BL1t, BL3t, . . . BLn–1t (or BL1b, BL3b, . . . BLn–1b). In addition, the gates of the transistors 42 and 44 are connected to a data inverting activation control signal $\phi_{SAEt}$ (or $\phi_{SAEb}$).

According to an embodiment of the present invention, the data inverting circuits 38t (or 38b), invert the data only during a read operation of memory cells storing data to be retained, i.e. unreprogrammed memory cells in a self-contained operation. In this cased the signal VSAt (or VSAb) becomes a data inverting voltage, i.e. the power supply voltage Vcc. According to the present invention, after the sense amplifiers sense and latch the data stored at the memory cells requiring the data no be retained; the latched data therein must be reprogrammed after these memory cells are erased. However, in the read operation of the preferred embodiment of the present invention, the bit lines associated with the memory cells storing the data "1", i.e. the erased memory cells, go to the logic "low" levels and thereby the sense amplifiers latch the data "0". However, the bit lines associated with the memory cells storing the data "0", i.e. the programmed memory cells go to the logic "high" levels and thereby the sense amplifiers latch the data "1".

Thereafter, when the data latched to the sense amplifiers is reprogrammed to the memory cells, the sense amplifiers which have latched the data "0" provide the logic "low" levels to the bit lines and thereby the memory cells associated therewith are programmed to the data "0", while the sense amplifiers which have latched the data "1" provide the logic "high" levels to the bit lines and thereby the memory cells associated therewith are inhibited from being programmed and maintain the erased data, i.e. the data "1". Therefore, the data of the memory cells during the read operation has an inverted relationship with the data programmed during the reprogramming operation. But, in the case that the data latched to the sense amplifiers during the read operation is identical to the data programmed to corresponding memory cells during the programming operation, there is no need to use the data inverting circuit.

Each of the sense amplifiers 39t (or 39b) is a conventional sense amplifier comprised of N-type MOS transistors 45 and 46 and P-type MOS transistors 47 and 48. These sense amplifiers 39t (or 39b) are activated by a sense amp activation control signal LAt (or LAb) which goes to a logic "low" level and a sense amp activation control signal LABt (or LABb) which goes to a logic "high" level.

The precharge circuits 40t (or 40b) serve to precharge or equalize the data lines DL1t to DLnt (or DL1b to DLnb) to a predetermined voltage, e.g. the power supply voltage Vcc or ½ Vcc. Each of the precharge circuits 40t (or 40b) is a conventional circuit comprised of N-type MOS transistors 49 to 51. The precharge circuits 40t (or 40b) precharge the data lines DL1t to DLnt (or DL1b to DLnb) by the signal VBLt (or VBLb) having the precharge voltage of Vcc or ½ Vcc in response to the data line precharge control signal $\phi_{EQt}$ (or $\phi_{EQb}$). That is, the precharge circuits 40t are activated by the data line precharge control signal $\phi_{EQt}$ which goes to a logic "high" level.

The first and second data lines of the data line pairs are connected to the I/O lines IO0t, $\overline{IO0t}$ to IO7t, $\overline{IO7t}$ (or IO0b, $\overline{IO0b}$ to IO7b, $\overline{IO7b}$) via a column select circuit 52t (or 52b) comprised of N type MOS transistors 53 and 54 which respond to the column select signals Y0t to Y1, 023t (or Y0b to Y1, 023b) applied from a column decoder (not shown). Thus, when one of the column select signals Y0t to Y1, 023t is at a logic "high" level, the column select circuit 52t can store to corresponding sense amplifiers 39t 8 bits of data on the I/O lines IO0t, $\overline{IO0t}$ to IO7t, $\overline{IO7t}$ input from external terminals via a data input buffer (not shown). In addition, the column select circuit 52t outputs 8 bits of data latched at the sense amplifiers 39t to the I/O lines IO0t, $\overline{IO0t}$ to IO7t, $\overline{IO7t}$. IO0t–$\overline{IO7t}$ (or IO0b–$\overline{IO7b}$) represent a complement relationship with IO0t–IO7t (or IO0b–IO7b).

Data transfer circuits 55 are connected between the data lines DL1t to DLnt and DL1b to DLnb. Each data transfer circuit 55 is comprised of isolation transistors 56, 57, 66 and 67 and inverters 58 to 65. The gates of the isolation transistors 56 and 57 are connected to a first transfer control signal ISO1 and the gates of the isolation transistors 66 and 67 are connected to a second transfer control signal ISO2. The isolation transistors 56, 57, 66 and 67 are N-type MOS transistors. In order to transfer the data stored at the sense amplifiers 39t to the sense amplifiers 39b, the transistors 56 and 57 are turned on in response to the first transfer control signal ISO1. Meanwhile, in order to transfer the data stored at the sense amplifiers 39b to the sense amplifiers 39t, the transistors 66 and 67 are turned on in response to the second transfer control signal ISO2.

The gates of verify transistors 68t to 71t are connected to the bit lines BL1t to BLnt and the gates of verify transistors 68b to 71b are connected to the bit lines BL1b to BLnb. The verify transistors 68t to 71t and 68b to 71b are N-type MOS transistors. The drains of the verify transistors 68t to 71t (68b to 71b) are connected to a signal ERVFt (ERVFb) which goes to the logic "high" level during the erase verification and the sources thereof to a signal ERVFGt (ERVFGb) which goes to the logic "low" level during the erase verification. During the erase verification operation, if any of the page-erased memory cells is not erased, the signal ERVFt (ERVFb) transits from the logic "high" level to the logic "low" level and thereby the erase verification can be performed. Such a technique is disclosed in U.S. patent application Ser. No. 08/597, 891.

The sense amplifiers 39t (or 39b) can sense and latch the data on the first bit lines BL1t, BL3t, . . . BLn–1t (BL1b, BL3b, . . . BLn–1b) or the data on the second bit lines BL2t, BL4t, . . . BLnt (BL2b, BL4b, . . . BLnb). The data stored at each sense amplifier 39t (39b) can be transferred to any one of the first and second bit lines. Thus, the data stored at the memory cells associated with the selected bit lines of the first and second bit lines must be accessed to the selected bit lines and the memory cells associated with the unselected bit lines cannot be accessed. During the programming operation, the data stored at the sense amplifiers can be programmed to the memory cells associated with the selected bit lines of the first and second bit lines. Therefore, as can be seen from FIG. 5, the data stored at the memory cells M51 to M5n are all erased by page-erasing the memory cells M51 to M5n connected to the word line WL5. Then, only half of the memory cells M51 to M5n are programmed after the data loading to the sense amplifiers via the I/O pins. In order to program the remaining half of the memory cells M51 to M5n, the external data must generally be loaded again to the sense amplifiers. These operations may be complicated and may require much time. Such problems are solved by the present invention.

Operations according to the preferred embodiments of the present invention will be discussed hereinbelow.

Embodiment 1

A first embodiment will be described which can contain the data without the use of the data transfer circuits 55 shown in FIGS. 6a and 6b. The first embodiment can be applied to EEPROMs having one memory cell array as well as a plurality of subarrays. For the convenience of description, the operation of the first embodiment associated with the bit lines BL1t to BLnt of FIG. 6a connected to the bit lines BL1 to BLn of FIG. 5 will be discussed with reference to the timing diagram of FIG. 8.

Figure 8:
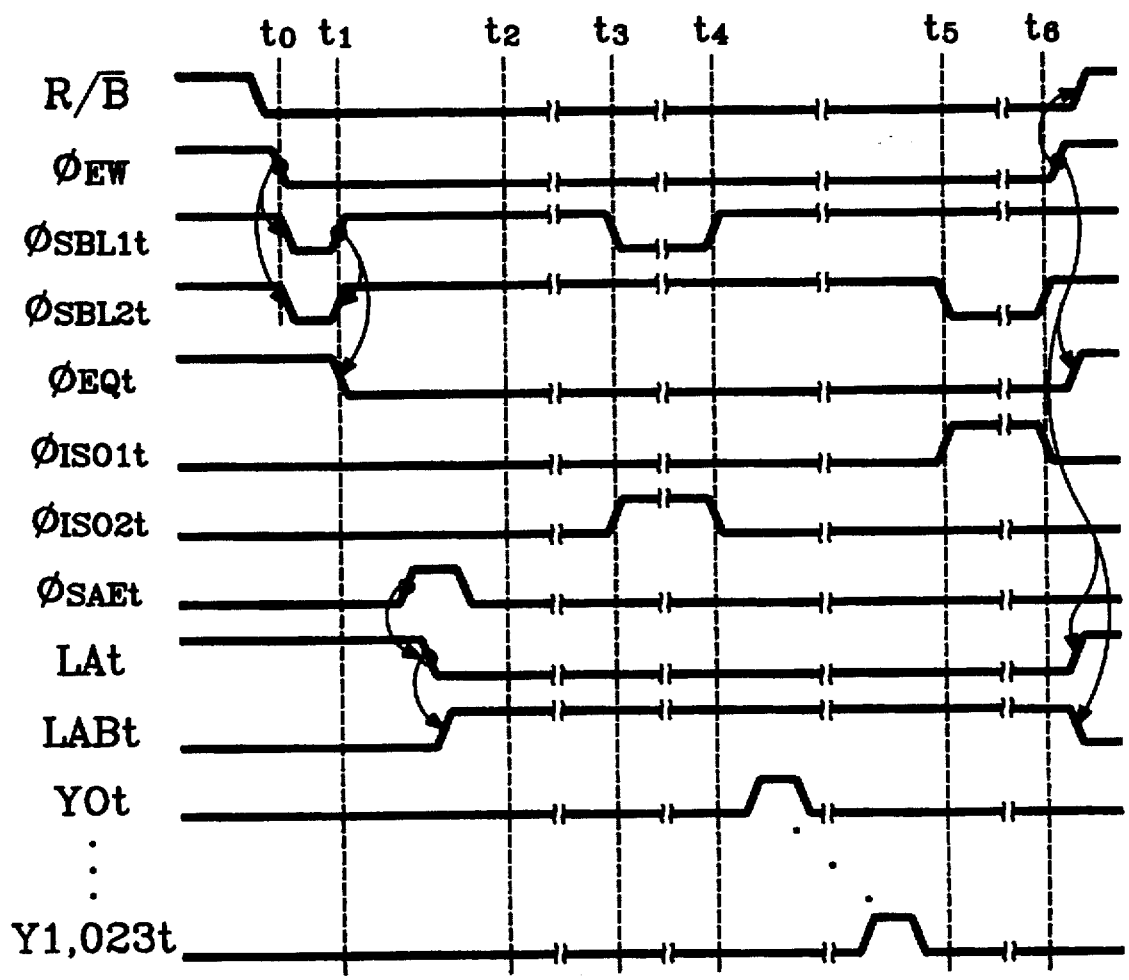
FIGS. 8 to 10 are timing diagrams showing the operating timing according to various embodiments of the present invention.

Referring to FIG. 8, a ready/busy signal R/$\overline{B}$ is output via an output terminal or a pin of the chip so as to show whether the chip of the EEPROM is in an operating state or in a standby state. For example, the ready/busy signal R/$\overline{B}$ of logic "high" level represents the operating state, such as read, program and verification operations, while the ready/busy signal R/$\overline{B}$ of logic "low" level represents the standby state of the chip. With the transition of the ready/busy signal R/$\overline{B}$ to the logic "low" level, the self-contained operation for the data is performed. Thereafter, the erase and write control signal $\phi_{EW}$ goes to the logic "low" level at time $t_0$, and then the first and second bit line precharge control signals $\phi_{SBL1t}$ and $\phi_{SBL2t}$ and the bit line equalizing control signal $\phi_{BLEQt}$ go to the logic "low" levels. Thereby, the bit lines BL1 to BLn are precharged to the precharge voltage VSBLt(=Vcc) during the time period between $t_0$ and $t_1$. At time $t_1$, the data line precharge control signal goes to the logic "low" level and thereby the precharge operation for the data lines DL1t to DLnt is completed. Thus, the data lines DL1t to DLnt are precharged to the precharge voltage VBLt (=½ Vcc). In addition, the precharging operation for the bit lines BL1 to BLn is also completed at time $t_1$.

For the convenience of description, it is assumed that the odd numbered memory cells M51, M53, . . . M5n–1 of the memory cells M51 to M5n connected to the word line WL5 within the memory block MBk of FIG. 5 are to be reprogrammed or renewed. Then, the data containing operation for the data stored at the even numbered memory cells M52, M54, . . . M5n must be performed before erasing the memory cells M51 to M5n connected to the word line WL5. In order to perform the data containing operation, the data stored at the even numbered memory cells M52, M54, . . . M5n must be latched at corresponding sense amplifiers 39t during the time period between $t_1$ and $t_2$. After the time $t_1$, the data stored at the even numbered memory cells M52, M54, . . . M5n are read out via the second bit lines BL2t, BL4t, . . . BLnt as described above. Thereafter, the data inverting circuits 38t are activated by the data inverting activation control signal $\phi_{SAEt}$, which goes to the logic "high" level. At this time, an inverting voltage VSAt(=Vcc) is supplied to the sources of the transistors 42 and 44. Thereafter, the sense amp activation control signals LAt and LABt go to the logic "low" and "high" levels, respectively, thus activating the sense amplifiers 39t. Thereby, the sense amplifiers 39t sense and latch the inverted data of the data stored at the even numbered memory cells M52, M54, . . . M5n. Thereafter, the data inverting activation control signal $\phi_{SAEt}$ goes to the logic "low" level and the data inverting circuits 38t become inactivated.

As described above, after storing to the sense amplifiers 39t the data required to be retained, i.e. the data stored at the even numbered memory cells M52, M54, ... M5n, the page-erasing and erase verification operations for the memory cells M51 to M5n connected to the word line WL5 are performed during the time period between $t_2$ and $t_3$.

After the page-erasing and erase verification operations, the data stored at the sense amplifiers 39t are programmed to the erased even numbered memory cells M52, M54, ... M5n. This programming operation is performed by making the first isolation control signal $\phi_{ISO1t}$ and the first bit line precharge control signal $\phi_{SBL1t}$ stay at the logic "low" levels and making the second isolation control signal $\phi_{ISO2t}$ and the second bit line precharge control signal $\phi_{SBL2t}$ stay at the logic "high" levels. At this time, the bit line equalizing signal $\phi_{BLEQt}$ stays at the logic "high" level. Thus, the first bit lines BL1t, BL3t, ... BLn-1t are precharged to the precharge voltage VSBLt (=Vcc) and thereby the odd numbered memory cells M51, M53, ... M5n-1 are inhibited from being programmed, as described above. Meanwhile; the data stored at the sense amplifiers 39t are programmed to the even numbered memory cells M52, M54, ... M5n via the transistors 37t and the second bit lines.

During the time period between $t_4$ and $t_5$, the data loading operation for the external data is performed. That is, the external data input via the data input terminals are stored at the sense amplifiers 39t via the data input buffer (not shown), data I/O lines IO0t, $\overline{IO0t}$ to IO7t, $\overline{IO7t}$ and the column select circuit 52t. The sense amplifiers 39t latch the external data by the column select circuit 52t which responds to the column select signals Y0t to Y1, 023t that sequentially go to the logic "high" level.

After completing the data loading operation, the external data stored at the sense amplifiers 39t is programmed to the odd memory cells M51, M53, ... M5n-1 during the period between $t_5$ and $t_6$. This programming operation is performed when the first isolation control signal $\phi_{ISO1t}$ and the first bit line precharge control signal $\phi_{SBL1t}$ stay at the logic "high" levels and the second isolation control signal $\phi_{ISO2t}$ and the second bit line precharge control signal $\phi_{SBL2t}$ stay at the logic "low" levels. At this time, the bit line equalizing signal $\phi_{BLEQt}$ stays at the logic "high" level. Thus, the external data stored at the sense amplifiers 39t is programmed to the odd numbered memory cells M51, M53, ... M5n-1 via the transistors 36t and the first bit lines, as described above. However, the second bit lines are precharged to the precharge voltage VSBLt (=Vcc) by the turned-on transistors 34 and thereby the even numbered memory cells M52, M54, ... M5n are inhibited from being programmed.

Thereafter, the erase and write control signal $\phi_{EW}$ goes to the logic "high" level thereby the data self-containing and programming operation is completed. Then, the ready/busy signal R/$\overline{B}$ goes to the logic "high" level and thereby the chip becomes the standby state. The data line precharge control signal $\phi_{EQt}$ goes to the logic "high" level and thereby the data lines DL1t to DLnt are precharged. Meanwhile, the sense amp activation control signals LAt and LABt go to the logic "high" and "low" levels, respectively, and thereby the sense amplifiers 39t are inactivated.

The above description relates to sense amplifiers and precharge circuits connected to one memory cell array. However, it can be easily understood by those skilled in the art that the first embodiment can be applied to EEPROMs having a plurality of subarrays. That is, such a technique can be achieved by connecting the bit lines of each subarray to the circuits except the data transfer circuit 55 in FIG. 6a.

Embodiment 2

A detailed description with respect to the second embodiment using the data transfer circuit 55 shown in FIG. 6a will now be given. The second embodiment is implemented for the circuits of FIG. 6a associated with the first and third subarray SMA1 and SAM3 of FIG. 4 and the circuits of FIG. 6b associated with the second and fourth subarrays SMA2 and SMA4. But, it should be noted by those skilled in the art that the present embodiment is not limited to EEPROMs having four subarrays but can be applied to EEPROMs having at least two subarrays.

Figure 9:
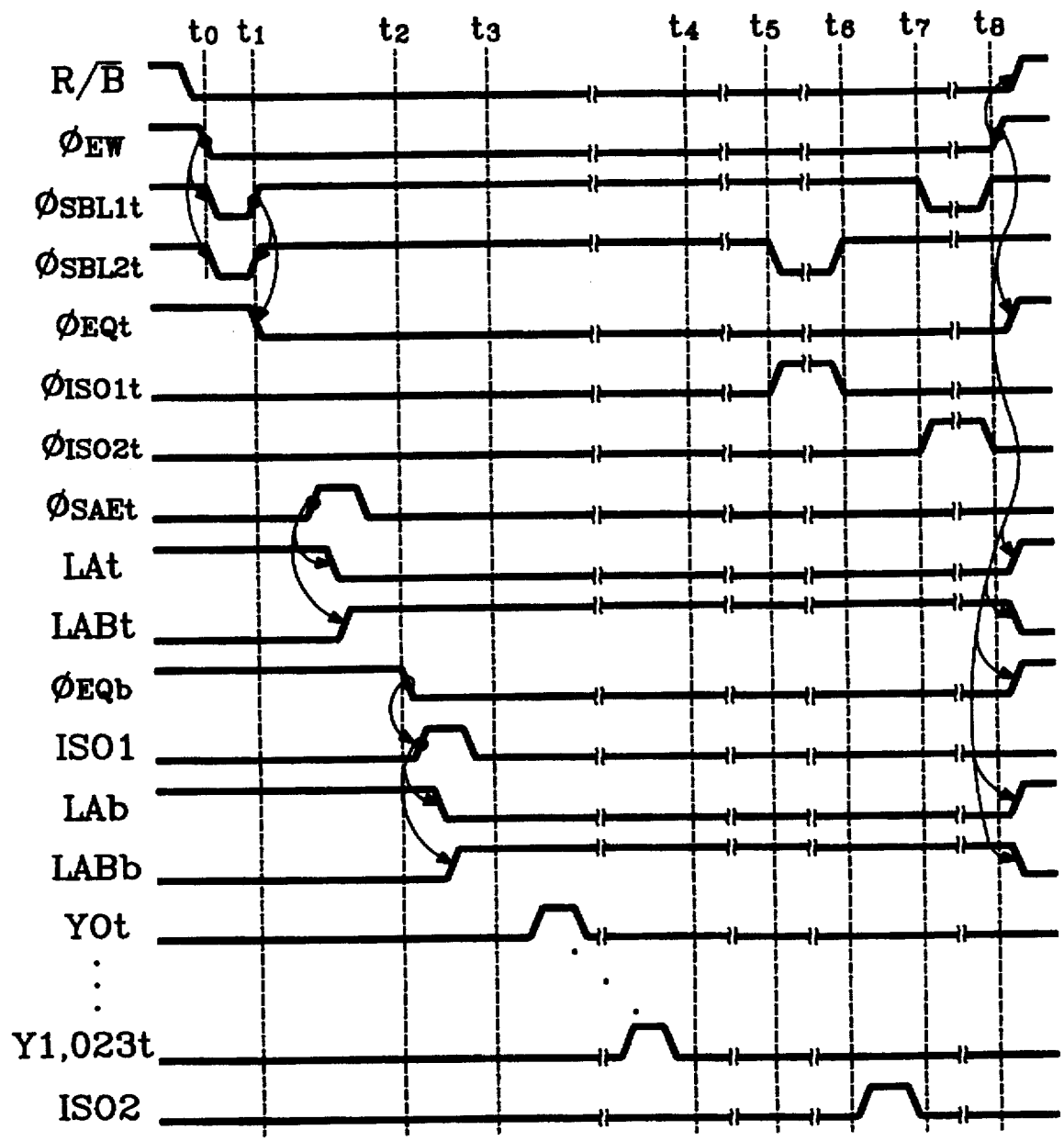

For the convenience of description, the EEPROM having two subarrays will be discussed with reference to FIGS. 6 and 9. It is assumed that the odd numbered memory cells M51, M53, ... M5n-1 of the memory cells M51 to M5n connected to the word line WL5 within the memory block MBk in the first subarray connected to the bit lines BL1t to BLnt of FIG. 6a are to be reprogrammed. Then, the second subarray connected to the bit lines BL1b to BLnb of FIG. 6b is not selected so as not to access the memory cells within this subarray. The operation performed during the time period between $t_0$ and $t_2$ of FIG. 9 is identical to that of the first embodiment. The data lines DL1b to DLnb are precharged to the precharge voltage VBLb (=Vcc) by the data line precharge control signal $\phi_{EQb}$ of logic "high" level. With the transition of the data line precharge control signal $\phi_{EQb}$ to the logic "low" level at time $t_2$, the precharging operation for the data lines DL1b to DLnb is completed.

During the time period between $t_2$ and $t_3$, the data latched at the sense amplifiers 39t associated with the selected first subarray are transferred and latched to the sense amplifiers 39b associated with the unselected second subarray. The sense amplifiers 39b associated with the second subarray latch the data latched at the sense amplifiers 39t in response to the first transfer control signal ISO1 which goes to the logic "high" level after the time $t_2$ and in response to the sense amp activation control signals LAb and LABb which go to the logic "low" and "high" levels, respectively. Thereafter, the first transfer control signal ISO1 goes to the logic "low" level and thereby the sense amplifiers 39t and 39b are isolated.

During the time period between $t_3$ and $t_4$, the external data input via the data input pins are loaded to the sense amplifiers 39t as described above with reference to the time period between $t_4$ and $t_5$ of FIG. 8. The sense amplifiers 39t latch the external data in response to the column select signals Y0t to Y1, 023t which sequentially go to the logic "high" levels.

During the time period between $t_4$ and $t_5$ after loading the external data, the memory cells M51 to M5n connected to the word line WL5 within the memory block MBk of the first subarray are erased and then erase-verified. During the time period between $t_5$ and $t_6$; the first isolation control signal $\phi_{ISO1t}$ remains at the logic "high" level so as to program the external data latched at the sense amplifiers 39t to the odd numbered memory cells M51, M53, ... M5n-1. In contrast, the second bit lines are precharged to the precharge voltage VSBLt (=Vcc) in response to the second bit line precharge control signal $\phi_{SBL2t}$ of logic "low" level so as to inhibit the even numbered memory cells M52, M54, ... M5n from being programmed.

During the time period between $t_6$ and $t_7$, the data latched at the sense amplifiers 39b associated with the second subarray are transferred and latched to the sense amplifiers 39t associated with the first subarray via the turned-on transistors 66 and 67 in response to the second transfer control signal ISO2 of logic "high" level. During the time period between $t_7$ and $t_8$, the data latched at the sense amplifiers 39t is programmed to the even numbered memory cells M52, M54, ... M5n via the second bit lines BL2t, BL4t, ... BLnt and the transistors 37t turned on in response to the second isolation control signal $\phi_{ISO2t}$ of logic "high" level. But, the first bit lines associated with the odd numbered memory cells M51, M53, ... M5n–1 are precharged to the precharge voltage VSBLt (=Vcc) via the transistors 33 which respond to the first bit line precharge signal $\phi_{SBLt}$ of logic "low" level, and thereby the odd numbered memory cells M51, M53, ... M5n–1 are inhibited from being programmed. The data self-containing and programming operation is completed by the transition of the erase and write control signal $\phi_{EW}$ to the logic "high" level, and thereby the ready/busy signal R/B goes to the logic "high" level. In addition, the data line precharge signals $\phi_{EQt}$ and $\phi_{EQb}$ and the sense amp activation control signals LAt and LAb go to the logic "high" levels and the sense amp activation control signals LABt and LABb go to the logic "low" levels. Thus, the data lines DL1t to DLnt and DL1b to DLnb are precharged and the sense amplifiers 39t and 39b are inactivated.

Embodiment 3

Figure 10:
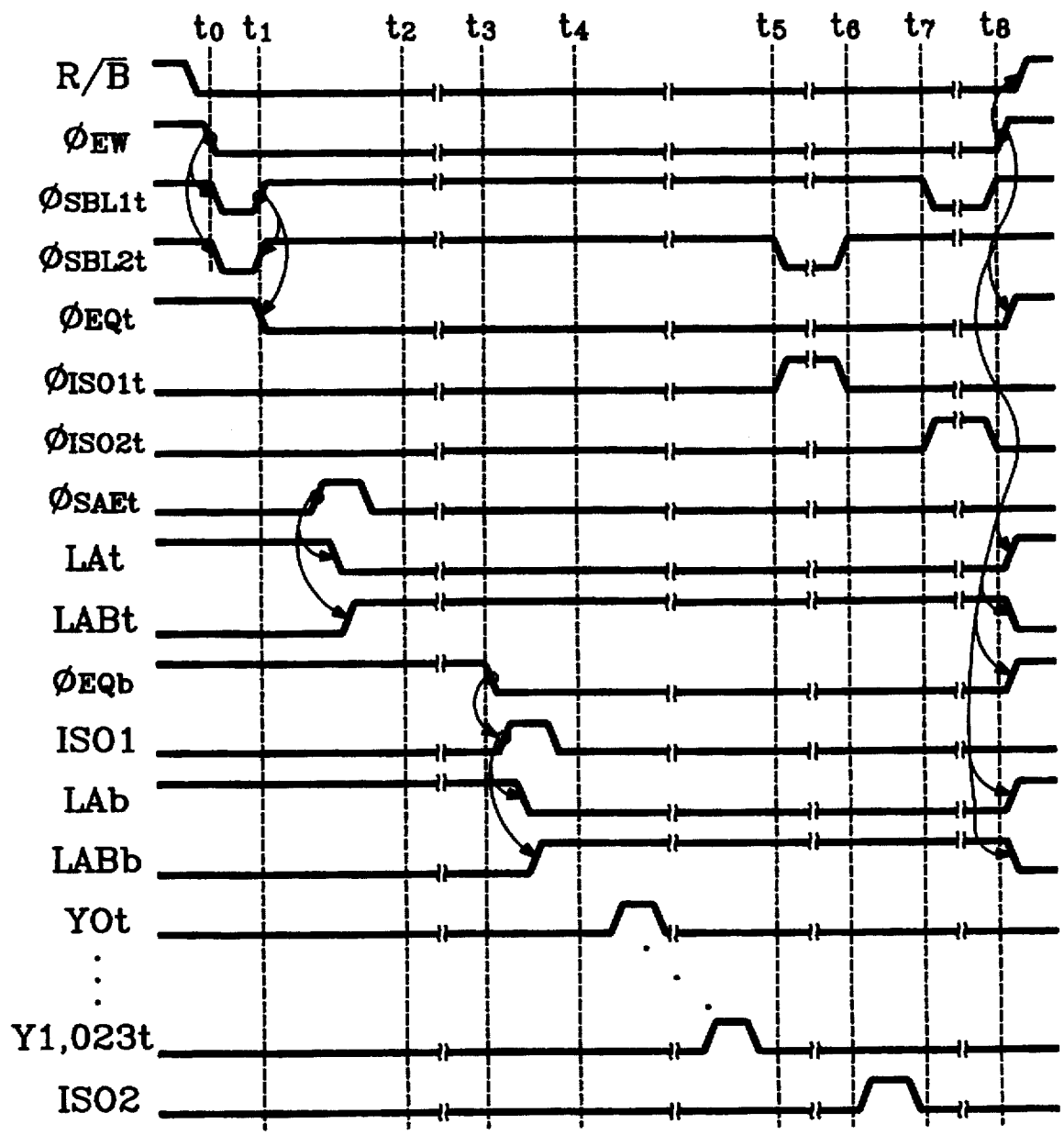

FIG. 10 is a timing diagram showing various control signals of FIGS. 6a and 6b according to a third embodiment.

In the third embodiment, during the time period between $t_1$ and $t_2$ of FIG. 10, the sense amplifiers 39t associated with the first subarray latch the data stored at the even numbered memory cells M52, M54, ... M5n which require the data to be retained. During the time period between $t_2$ and $t_3$, the page-erasing and erase verification operation for the memory cells M51 to M5n is performed. Thereafter, during the time period between $t_3$ and $t_4$ of FIG. 10, the data latched at the sense amplifiers 39t associated with the first subarray are transferred to the sense amplifiers 39b associated with the second subarray in the same manner as the operation performed during the time period between $t_2$ and $t_3$ of FIG. 9.

During the time period between $t_4$ and $t_5$, the external data are loaded to the sense amplifiers 39t associated with the first subarray in the same manner as the operation performed during the time period between $t_3$ and $t_4$ of FIG. 9. The operations after the time $t_5$ are identical to those of FIG. 9.

As described above, the present invention has an advantage that the data stored at the memory cells which are not to be reprogrammed (renewed) can be retained before page-erasing, thus reducing the program time and enhancing the performance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A nonvolatile integrated circuit memory device comprising:
   a memory cell array, including a plurality of cell units arranged in rows and columns, each cell unit comprising a column of a plurality of serially connected memory cells, each of said memory cells comprising a floating gate and a control gate;
   a plurality of bit line pairs, each of which includes a first and a second bit line, one end of a respective cell unit being connected to a respective one of said bit lines in said plurality of bit line pairs;
   a plurality of word lines, a respective one of which is connected to the control gates of the memory cells of a plurality of cell units in a respective row;
   a plurality of shared latching sense amplifiers, a respective one of which is connected to the first and second bit lines of a respective bit line pair; and
   means for latching data from selected ones of said memory cells which are connected to a selected one of said word lines, into said plurality of shared latching sense amplifiers prior to erasing the memory cells which are connected to said selected one of said word lines, and for resupplying the latched data from said plurality of shared sense amplifiers to said selected ones of said memory cells which are connected to said selected one of said word lines after erasing the memory cells which are connected to said selected one of said word lines, to thereby internally reprogram the latched data into erased memory cells after page erasing.

2. A nonvolatile integrated circuit memory device according to claim 1 wherein said latching and resupplying means further comprises:
   means for transferring latched data from selected ones of said plurality of shared sense amplifiers to selected others of said plurality of shared sense amplifiers prior to erasing the memory cells which are connected to said selected one of said word lines, and for retransferring latched data from said selected others of said shared sense amplifiers to said selected ones of said shared sense amplifiers after erasing the memory cells which are connected to said selected one of said word lines.

3. A nonvolatile integrated circuit memory device according to claim 1 wherein said latching and resupplying means further comprises:
   a plurality of data inverting circuits, a respective one of which is connected between a respective bit line pair and a respective shared latching sense amplifier, to invert the data from selected ones of said memory cells which are connected to a selected one of said word lines which is latched into said plurality of shared latching sense amplifiers prior to erasing the memory cells which are connected to said selected one of said word lines.

4. A nonvolatile integrated circuit memory device according to claim 3 further comprising:
   means for disabling said plurality of data inverting circuits from inverting the latched data which is resupplied from said plurality of shared sense amplifiers to said selected ones of said memory cells which are connected to said selected one of said word lines after erasing the memory cells which are connected to said selected one of said word lines.

5. A nonvolatile integrated circuit memory device according to claim 1 further comprising:
   means for supplying a program inhibit voltage to unselected ones of said first and second bit lines when resupplying the latched data from said plurality of shared sense amplifiers to said selected ones of said memory cells which are connected to said selected one of said word lines after erasing the memory cells which are connected to said selected one of said word lines.

6. A nonvolatile integrated circuit memory device comprising:

a memory cell array including at least first and second subarrays, each subarray including a plurality of cell units arranged in rows and columns, each cell unit comprising a column of a plurality of serially connected memory cells, each of said memory cells comprising a floating gate and a control gate;

each subarray further including a plurality of bit line pairs, each of which includes a first and a second bit line, one end of a respective cell unit being connected to a respective one of said bit lines in said plurality of bit line pairs, and a plurality of word lines, a respective one of which is connected to the control gate of the memory cells of a plurality of cell units in a respective row;

each subarray further including a plurality of shared latching sense amplifiers, a respective one of which is connected to the first and second bit lines of a respective bit line pair; and data transferring means, connected to the shared latching sense amplifiers in said first subarray and said second subarray, for transferring sensed and latched data between said plurality of shared latching sense amplifiers in said first subarray and said plurality of shared latching sense amplifiers in said second subarray.

7. A nonvolatile integrated circuit memory device according to claim 6 wherein said data transferring means comprises:

means for latching data from selected ones of said memory cells which are connected to a selected one of said word lines in a selected one of said first and second subarrays into said plurality of shared latching sense amplifiers in said unselected one of said first and second subarrays prior to erasing the memory cells which are connected to said selected one of said word lines in said selected one of said first and second subarrays, and for resupplying the latched data from said plurality of shared sense amplifiers in said unselected one of said first and second subarrays to said selected ones of said memory cells which are connected to said selected one of said word lines in said selected one of said first and second subarrays after erasing the memory cells which are connected to said selected one of said word lines in said selected one of said first and second subarrays, to thereby internally reprogram data into erased memory cells after page erasing.

8. A nonvolatile integrated circuit memory device according to claim 6 wherein said data transferring means comprises:

means for latching data which is stored at unselected memory cells which do not require reprogramming and which are connected to a selected word line of a selected one of said first and second memory subarrays; into said plurality of shared latching sense amplifiers in said selected one of said first and second memory subarrays via the unselected bit lines of said first and second bit lines which are associated with said unselected memory cells prior to erasing the memory cells which are connected to said selected one of said word lines in said selected one of said first and second subarrays, and for transferring the data latched into said plurality of shared latching sense amplifiers in said selected one of said first and second memory subarrays to said plurality of shared latching sense amplifiers in the other of said first and second memory subarrays.

9. A method of reprogramming a nonvolatile integrated circuit memory device having a memory cell array, including a plurality of cell units arranged in rows and columns, each cell unit comprising a column of a plurality of serially connected memory cells, each of said memory cells comprising a floating gate and a control gate; a plurality of bit line pairs, each of which includes a first and a second bit line, one end of a respective cell unit being connected to a respective one of said bit lines in said plurality of bit line pairs; a plurality of word lines, a respective one of which is connected to the control gate of the memory cells of a plurality of cell units in a respective row; and a plurality of shared latching sense amplifiers, a respective one of which is connected to the first and second bit lines of a respective bit line pair; said reprogramming method comprising the steps of:

latching data from selected ones of said memory cells which are connected to a selected one of said word lines into said plurality of shared latching sense amplifiers prior to erasing the memory cells which are connected to said selected one of said word lines; and resupplying the latched data from said plurality of shared sense amplifiers to said selected ones of said memory cells which are connected to said selected one of said word lines, after erasing the memory cells which are connected to said selected one of said word lines.

10. A method according to claim 9:

wherein said latching step comprises the step of transferring data from selected ones of said plurality of shared sense amplifiers to selected others of said plurality of shared sense amplifiers prior to erasing the memory cells which are connected to said selected one of said word lines; and wherein said resupplying step comprises the step of retransferring data from said selected others of said shared sense amplifiers to said selected ones of said shared sense amplifiers after erasing the memory cells which are connected to said selected one of said word lines.

11. A method of reprogramming a nonvolatile integrated circuit memory device comprising a memory cell array including at least first and second subarrays, each subarray including a plurality of nonvolatile memory cells arranged in rows and columns, a plurality of bit line pairs, each of which includes a first and a second bit line, and a plurality of shared latching sense amplifiers, a respective one of which is connected to the first and second bit lines of a respective bit line pair; said reprogramming method comprising the step of:

using shared latching sense amplifiers in said second subarray, to latch data from memory cells in said first subarray, which are to be reprogrammed after a page erase of said first subarray.

12. A method according to claim 11 wherein said using step comprises the step of:

transferring sensed and latched data between said plurality of shared latching sense amplifiers in said first subarray and said plurality of shared latching sense amplifiers in said second subarray.

13. A method according to claim 12 wherein said memory device further includes a plurality of word lines, a respective one of which is connected to the memory cells in a respective row, and said transferring step comprises the steps of:

latching data from selected ones of said memory cells which are connected to a selected one of said word lines in a selected one of said first and second subarrays into said plurality of shared latching sense amplifiers in said unselected one of said first and second subarrays prior to erasing the memory cells which are connected to said selected one of said word lines in said selected one of said first and second subarrays; and resupplying the latched data from said plurality of shared sense amplifiers in said unselected one of said first and second subarrays to said selected ones of said memory cells which are connected to said selected one of said word lines in said selected one of said first and second subarrays after erasing the memory cells which are connected to said selected one of said word lines in said selected one of said first and second subarrays.

14. A method according to claim 12 wherein said memory device further includes a plurality of word lines, a respective one of which is connected to the memory cells in a respective row, and said transferring step comprises the steps of:

latching data which is stored at unselected memory cells which do not require reprogramming and which are connected to a selected word line of a selected one of said first and second memory subarrays; into said plurality of shared latching sense amplifiers in said selected one of said first and second memory subarrays via the unselected bit lines of said first and second bit lines which are associated with said unselected memory cells prior to erasing the memory cells which are connected to said selected one of said word lines in said selected one of said first and second subarrays; and transferring the data latched into said plurality of shared latching sense amplifiers in said selected one of said first and second memory subarrays to said plurality of shared latching sense amplifiers in the other of said first and second memory subarrays.

* * * * *

UNITED STATES PATENT AND TRADEMARK OFFICE
CERTIFICATE OF CORRECTION

PATENT NO. : 5,732,018
DATED : March 24, 1998
INVENTOR(S) : Do-Chan Choi et al.

It is certified that error appears in the above-identified patent and that said Letters Patent is hereby corrected as shown below:

| | |
|---|---|
| Column 1, Line 45 | Change "ii" to -- 11 --. |
| Column 2, Line 10 | Change "in order" to -- In order --. |
| Column 10, Line 61 | Change "Therefore;" to -- Therefore, --. |
| Column 10, Line 66 | Change "Meanwhile;" to -- Meanwhile, --. |
| Column 11, Line 66 | Change "100" to -- $\phi$ --. |
| Column 12, Line 23 | Change "cased" to -- case, --. |
| Column 12, Line 27 | Change "retained;" to -- retained, --. |
| Column 14, Line 31 | Change "t$_o$" to -- t$_0$ --. |
| Column 14, Line 36 | Change "t$_o$" to -- t$_0$ --. |
| Column 14, Line 37 | Insert "$\phi_{EQT}$" after "signal". |
| Column 15, Line 22 | Change "Meanwhile;" to -- Meanwhile, --. |
| Column 15, Line 54 | Insert "and" after "level". |
| Column 16, Line 25 | Change "t$_o$" to -- t$_0$ --. |
| Column 16, Line 56 | Change "t$_6$;" to -- t$_6$, --. |
| Column 17, Line 44 | Change "39," to -- 39t --. |
| Column 19, Line 52 | Change "subarrays;" to -- subarrays, --. |
| Column 22, Line 2 | Change "subarrays;" to -- subarrays, --. |

Signed and Sealed this

Nineteenth Day of January, 1999

Attest:

Attesting Officer

Acting Commissioner of Patents and Trademarks